(12) United States Patent
Matsumoto

(10) Patent No.: US 11,690,178 B2
(45) Date of Patent: Jun. 27, 2023

(54) MULTILAYER PRINTED WIRING BOARD AND METHOD OF MANUFACTURING THE SAME

(71) Applicant: TOPPAN PRINTING CO., LTD., Tokyo (JP)

(72) Inventor: Hiroshi Matsumoto, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 404 days.

(21) Appl. No.: 16/923,373

(22) Filed: Jul. 8, 2020

(65) Prior Publication Data

US 2020/0337156 A1  Oct. 22, 2020

Related U.S. Application Data

(60) Division of application No. 15/987,182, filed on May 23, 2018, which is a continuation of application No. PCT/JP2016/083375, filed on Nov. 10, 2016.

(30) Foreign Application Priority Data

Nov. 30, 2015 (JP) ................................. 2015-233243

(51) Int. Cl.
*H05K 3/38* (2006.01)
*H05K 3/42* (2006.01)
(Continued)

(52) U.S. Cl.
CPC ................ *H05K 3/38* (2013.01); *H05K 1/03* (2013.01); *H05K 1/115* (2013.01); *H05K 3/423* (2013.01);
(Continued)

(58) Field of Classification Search
CPC .......... B25K 26/36; H05K 1/03; H05K 1/115; H05K 3/0035; H05K 3/0055; H05K 3/244;
(Continued)

(56) References Cited

U.S. PATENT DOCUMENTS

2008/0308964 A1  12/2008  Amatani et al.
2009/0288870 A1  11/2009  Kondo et al.
(Continued)

FOREIGN PATENT DOCUMENTS

CN    101322967 A    12/2008
EP    2 645 830 A1   10/2013
(Continued)

OTHER PUBLICATIONS

Office Action dated Mar. 16, 2021 for corresponding Chinese Patent Application No. 201680066089.9.
(Continued)

*Primary Examiner* — Carl J Arbes
(74) *Attorney, Agent, or Firm* — Foley & Lardner LLP

(57) ABSTRACT

A multilayer printed wiring board and a method of manufacturing the same are provided. A multilayer printed wiring board of the present embodiment includes: a core base material formed by laminating a first wiring layer and a first insulating layer in this order on an insulating substrate; and a built-up layer formed by laminating a second wiring layer and a second insulating layer in this order on the core base material. A primer layer is formed between the second wiring layer and the first insulating layer, the second wiring layer has a lower surface at least part of which is in contact with the primer layer, and the second wiring layer has an upper surface and a side surface on both of which a tin-plated layer and a silane coupling layer are formed in this order.

9 Claims, 6 Drawing Sheets

(51) Int. Cl.
    *H05K 1/03*    (2006.01)
    *H05K 1/11*    (2006.01)
    *H05K 3/46*    (2006.01)
    *H05K 3/24*        (2006.01)
    *H05K 3/00*        (2006.01)
    *B23K 26/36*       (2014.01)

(52) U.S. Cl.
    CPC ......... *H05K 3/4602* (2013.01); *H05K 3/4626* (2013.01); *H05K 3/4644* (2013.01); *B23K 26/36* (2013.01); *H05K 3/0035* (2013.01); *H05K 3/0055* (2013.01); *H05K 3/244* (2013.01); *H05K 3/389* (2013.01); *H05K 2201/0195* (2013.01); *H05K 2203/0554* (2013.01)

(58) Field of Classification Search
    CPC .......... H05K 3/38; H05K 3/389; H05K 3/423; H05K 3/4602; H05K 3/4626; H05K 3/4644; H05K 2201/0195; H05K 2203/0554
    See application file for complete search history.

(56) References Cited

U.S. PATENT DOCUMENTS

| | | | |
|---|---|---|---|
| 2011/0232943 A1 | 9/2011 | Hida et al. | |
| 2012/0082779 A1* | 4/2012 | Akai | H05K 3/384 |
| | | | 205/125 |
| 2012/0205142 A1 | 8/2012 | Higo et al. | |
| 2012/0213944 A1 | 8/2012 | Yamauchi et al. | |
| 2014/0186581 A1 | 7/2014 | Lee et al. | |
| 2015/0096173 A1 | 4/2015 | Yu et al. | |
| 2015/0342039 A1 | 11/2015 | Wu | |

FOREIGN PATENT DOCUMENTS

| | | |
|---|---|---|
| JP | H10-135638 A | 5/1998 |
| JP | 2009-123986 A | 6/2009 |
| JP | 2011-049289 A | 3/2011 |
| JP | 4850525 B2 | 1/2012 |
| JP | 2012-216773 A | 11/2012 |
| JP | 2014-067941 A | 4/2014 |
| JP | 2015-513005 A | 4/2015 |

OTHER PUBLICATIONS

Office Action dated Jul. 17, 2020 for corresponding Chinese Patent Application No. 201680066089.9.

International Searching Authority, "International Search Report," issued in connection with International Patent Application No. PCT/JP2016/083375, dated Feb. 7, 2017.

International Searching Authority, "Written Opinion," issued in connection with International Patent Application No. PCT/JP2016/083375, dated Feb. 7, 2017.

Extended European Search Report issued in corresponding European Patent Application Ser. No. 16870410.4, dated Jun. 17, 2019.

Office Action issued in connection with EP Appl. Ser. No. 16870410.4 dated Apr. 13, 2023.

* cited by examiner

MULTILAYER PRINTED WIRING BOARD AND METHOD OF MANUFACTURING THE SAME

CROSS-REFERENCE TO RELATED PATENT APPLICATIONS

This application is a Divisional of U.S. patent application Ser. No. 15/987,182, filed on May 23, 2018, which is a Bypass Continuation of International Application No. PCT/JP2016/083375, filed on Nov. 10, 2016, which is based upon and claims the benefit of priority to Japan Priority Application No. 2015-233243, filed on Nov. 30, 2015. The entire contents of which are hereby incorporated by reference in their entireties.

TECHNICAL FIELD

The present invention relates to a multilayer printed wiring board and a method of manufacturing the same.

BACKGROUND ART

Printed wiring boards are widely used for mounting electronic components, semiconductor devices, or other elements. Along with the recent need for miniaturizing electronic devices and for enhancing functionality of these devices, printed wiring boards are desired to have higher circuit density or smaller thickness, or adaptability to radio frequency.

Methods of manufacturing such high-density printed wiring boards include a buildup technique which is known to be used for producing multilayer built-up wiring boards. In this technique, a multilayer built-up wiring board is formed by forming an insulating layer on a core layer (core substrate), which is a laminate of an insulating substrate and a wiring layer formed on the substrate, followed by further forming a wiring layer on the insulating layer, and repeating alternate formation of an insulating layer and a wiring layer.

For example, as a conventional method, a semi-additive method is used for forming a wiring layer of a multilayer built-up wiring board. For example, techniques related to the semi-additive method are described in PTLs 1 and 2.

CITATION LIST

[Patent Literature] [PTL 1] JP 2009-123986 A; [PTL 2] JP 2012-216773 A

SUMMARY OF THE INVENTION

Technical Problem

Conventional printed wiring boards manufactured using the semi-additive method, however, suffer from transmission delay of high-frequency signals in the wiring layer, or difficulty in obtaining a designed line width that is attributed to decrease in the width of the wiring layer during manufacture.

The present invention has been made in view of such circumstances and has an object to provide a multilayer printed wiring board which reduces or prevents transmission delay of high-frequency signals through a wiring layer, and includes a wiring layer with a designed line width even when a semi-additive method is used, and to provide a method of manufacturing the multilayer printed wiring board.

Solution to Problem

To solve the abovementioned problems, a multilayer printed wiring board according to an aspect of the present invention includes: a core base material formed by laminating a first wiring layer and a first insulating layer in this order on an insulating substrate, and a built-up layer formed by laminating a second wiring layer and a second insulating layer in this order on the core base material. In the multilayer printed wiring board, a primer layer is formed between the second wiring layer and the first insulating layer, the second wiring layer has a lower surface at least part of which is in contact with the primer layer, and the second wiring layer has an upper surface and a side surface on both of which a tin-plated layer and a silane coupling layer are formed in this order.

A method of manufacturing a multilayer printed wiring board according to an aspect of the present invention provides a printed wiring board including a plurality of layers formed on a laminate that is a lamination of an insulating substrate and a first wiring layer formed on the insulating substrate. The method includes at least: a first step of forming a first insulating layer on the laminate so as to cover the first wiring layer; a second step of forming a primer layer and a copper layer in this order on the first insulating layer, the primer layer increasing adhesion between the first insulating layer and the copper layer; a third step of forming via holes penetrating the copper layer, the primer layer, and the first insulating layer to expose a surface of the first wiring layer; a fourth step of performing desmear treatment for removing smears generated in the via holes; a fifth step of removing the copper layer and exposing a surface of the primer layer, following the fourth step; a sixth step of forming a copper electroless-plated layer on the surface of the primer layer and bottom surfaces and sidewall surfaces of the via holes, following the fifth step; a seventh step of forming a resist pattern on a surface of the copper electroless-plated layer in regions where a second wiring layer is not to be formed, the resist pattern serving as a plating mask; an eighth step of forming a copper electroplated layer on a surface of the copper electroless-plated layer in regions where the resist pattern has not been formed; a ninth step of peeling the resist pattern, following the eighth step; a tenth step of removing the copper electroless-plated layer in regions empty of the resist pattern, following the ninth step, to form a second wiring layer and expose the surface of the primer layer, the second wiring layer including the copper electroless-plated layer and the copper electroplated layer; an eleventh step of forming a tin-plated layer on a surface of the second wiring layer and then forming a silane coupling layer on a surface of the tin-plated layer; and a twelfth step of forming a second insulating layer so as to cover the primer layer and the second wiring layer where the tin-plated layer and the silane coupling layer have been formed.

Advantageous Effects of the Invention

With the multilayer printed wiring board and the method of manufacturing the same according to an aspect of the present invention, a multilayer printed wiring board reducing or preventing transmission delay of high-frequency signals through a wiring layer and a method of manufacturing the multilayer printed wiring board can be provided. Furthermore, a multilayer printed wiring board provided with a wiring layer with a designed line width, and a method of manufacturing the same can be provided.

DESCRIPTION OF THE REPRESENTATIVE EMBODIMENTS

Figure 1A:
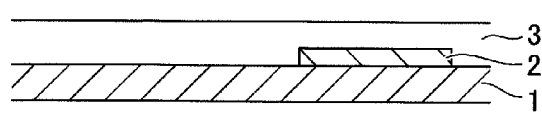
FIGS. 1A, 1B, 1C, 1D, 1E, 1F, 1G, 1H, 1I, 1J, 1K, and 1L, is a set of schematic cross sections illustrating a flow of manufacturing a printed wiring board according to a first embodiment of the present invention.

With reference to the drawing, first to fourth embodiments of the present invention will be described. It is to be understood that the embodiments below are intended to be representative of the present invention. The present invention is not necessarily limited to the representative embodiments.

Since the drawings are only schematic, the relationship between thickness and planar dimension, the thickness ratio between layers, and the like are not to scale. For simplification, known structures are schematically illustrated. In the drawings, components exerting identical or similar functions are given the same reference signs to omit duplicate description. The embodiments described below are merely examples of configurations for embodying the technical idea of the present invention, and the technical idea of the present invention should not limit the materials, shapes, structures, and the like of the components to those described below. The technical idea of the present invention can be variously modified within the technical scope defined in the claims.

First Embodiment (Process of Manufacturing Printed Wiring Board 101)

Referring to FIGS. 1A, 1B, 1C, 1D, 1E, 1F, 1G, 1H, 1I, 1J, 1K, and 1L, a process of manufacturing a printed wiring board (multilayer printed wiring board) 101 according to a first embodiment of the present invention will be described.

The printed wiring board 101 according to the present embodiment includes a wiring layer that is formed on an insulating substrate 1 using a semi-additive method.

First, as shown in FIG. 1A, a first wiring layer 2 is formed on the insulating substrate 1, and then a first insulating resin layer (first insulating layer) 3 is formed covering the first wiring layer 2. In the present embodiment, this process is referred to as a first step.

Figure 1B:
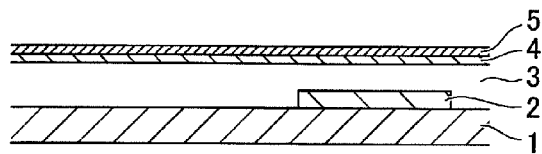

Then, as shown in FIG. 1B, a primer layer 4 is formed on the first insulating resin layer 3, and a copper layer 5 is formed on the primer layer 4. In the present embodiment, this process is referred to as a second step.

The copper layer 5 on the primer layer 4 may be a layer formed, for example, by pressure joining of copper foil, or may be an electroless copper plated layer formed by electroless plating, or may be a thin copper layer formed by sputtering, vacuum deposition, or the like. Instead of forming the primer layer 4 and the copper layer 5 in this order on the first insulating resin layer 3, a copper layer 5 provided with a primer layer 4 may be pressure-joined to the first insulating resin layer 3 such that the surface provided with the primer layer 4 faces the first insulating resin layer 3. The method of forming the primer layer 4 should not be particularly limited. For example, materials may be immersed in a bath containing a chemical agent that forms the primer layer 4, followed by drying, or may be sprayed with a liquid containing the chemical agent, followed by drying. When copper foil is used as the copper layer 5, the copper foil preferably has a surface roughness of 1.0 μm or less in terms of ten-point mean average Rz, or 0.1 μm or less in terms of arithmetic mean roughness Ra. For example, use of copper foil having a rough surface (exceeding 1.5 μm in terms of Rz) such as of an electrolytic copper foil is not appropriate.

Any material may be used for the primer layer 4 as long the material ensures adhesion between the first insulating resin layer 3 and the copper layer 5. Examples of such a material include materials containing an epoxy resin, a polyimide resin, or a polyamide resin. The primer layer 4 preferably has a dry thickness of 3 μm or less. The copper layer 5 preferably has a thickness of 3 μm or less.

Figure 1C:
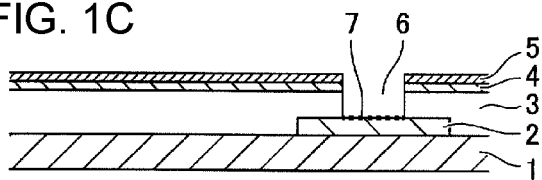

Then, as shown in FIG. 1C, via holes 6 are formed such as by laser irradiation, penetrating the copper layer 5, the primer layer 4, and the first insulating resin layer 3 to expose the surface of the first wiring layer 2. In the present embodiment, this process is referred to as a third step.

For example, various lasers can be used for this laser irradiation, including a carbon dioxide laser, a YAG laser, and an excimer laser. When the via holes 6 are formed by laser irradiation, smears 7 remain on the bottom surfaces of the via holes 6, or the sidewall surfaces (inner surfaces) thereof. The smears 7 herein are residues of the insulating resin generated as a result of laser irradiation. FIG. 1C shows an example of a state where the smears 7 have been left on the surface of the first wiring layer 2 which corresponds to the bottom surfaces of the via holes 6.

Figure 1D:
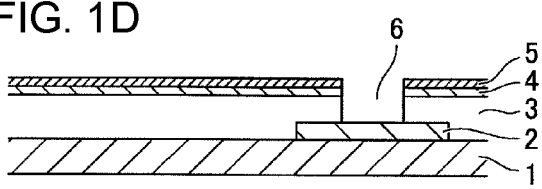

Then, as shown in FIG. 1D, the smears 7 are removed by desmear treatment. In the present embodiment, this process is referred to as a fourth step. The desmear treatment may be a desmear process used in an ordinary manufacturing process of printed wiring boards.

In the present embodiment, the surface of the first insulating resin layer 3 is not roughened even when the desmear treatment is applied because the surface is at least covered with the copper layer 5.

Figure 1E:
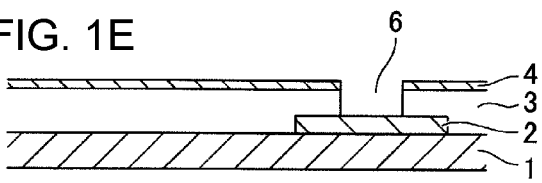

Then, as shown in FIG. 1E, the copper layer 5 is removed to expose the surface of the primer layer 4. In the present embodiment, this process is referred to as a fifth step. The copper layer 5 is preferably etched away using a copper etching solution. As the copper etching solution, not only a ferric chloride etching solution, but also various etching solutions, such as a sulfuric acid/hydrogen peroxide etching solution, can be used.

Figure 1F:
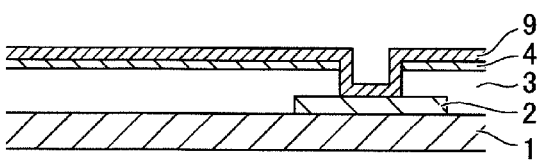

Then, as shown in FIG. 1F, an electroless copper plated layer 9 is formed by electroless plating to cover the bottom surfaces of the via holes 6, the sidewall surfaces thereof, and the surface of the primer layer 4. In the present embodiment, this process is referred to as a sixth step.

Figure 1G:
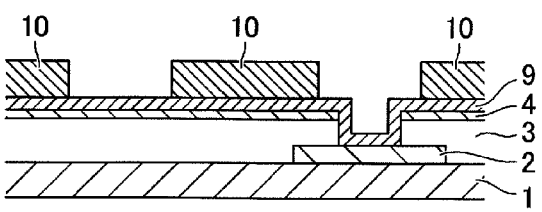

Then, as shown in FIG. 1G, a resist pattern 10 is formed on the copper electroless-plated layer 9 to cover non-wiring portions (regions) where a second wiring layer 12, described later, is not to be formed. In the present embodiment, this process is referred to as a seventh step. As a method of forming the resist pattern 10, typical photolithography may be used. For example, a negative dry film may be used as a photosensitive resist material for forming the resist pattern 10. After lamination of the dry film, the film may be exposed using a photomask having a desired pattern, followed by development, thereby obtaining the resist pattern 10.

Figure 1H:
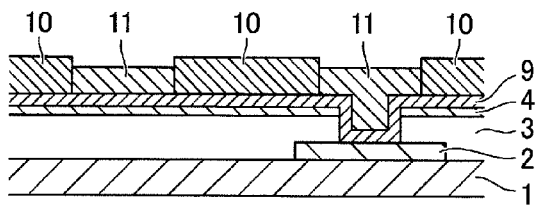

Then, as shown in FIG. 1H, a copper electroplated layer 11 is formed by copper electroplating on the copper electroless-plated layer 9 on which the resist pattern 10 is formed. In the present embodiment, this process is referred to as an eighth step. The copper electroplating can be performed using a copper electroplating device which uses a copper sulfate bath that is used in an ordinary manufacturing process of printed wiring boards.

Figure 1I:
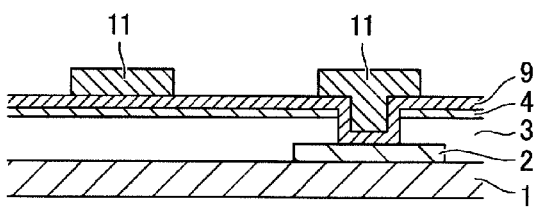

Then, as shown in FIG. 1I, the resist pattern 10 is removed to expose the surface of the copper electroless-plated layer 9 that has been covered with the resist pattern 10. In the present embodiment, this process is referred to as a ninth step. The resist pattern 10 can be removed by immersing, for a prescribed time, the substrate provided with the resist pattern 10 in a resist stripping bath containing a resist stripping liquid suitable for the resist material used, and then washing away the resist stripping liquid adhered to the substrate with water, followed by drying.

Figure 1J:
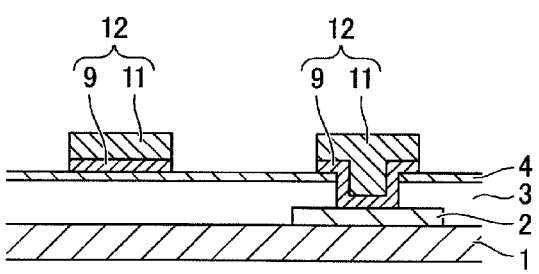

Then, as shown in FIG. 1J, the copper electroless-plated layer 9 is etched away at portions where the surface has been exposed at the ninth step, that is, portions empty of the resist pattern 10, thereby forming a second wiring layer 12 including the copper electroless-plated layer 9 and the copper electroplated layer 11. In the present embodiment, this process is referred to as a tenth step. When etching away the copper electroless-plated layer 9, an etching solution enabling lower-speed etching than an iron-based etching solution is used because of the small thickness of the copper electroless-plated layer 9. For example, an ammonium persulfate etching solution, a sulfuric acid/hydrogen peroxide etching solution, or the like can be used.

In this case, since the lower surface of the copper electroless-plated layer 9 is not roughened, etching time does not need to be increased to completely remove the copper in the concavities, unlike when etching away copper caught in the concavities in the asperities formed on a roughened surface. Accordingly, when the copper electroless-plated layer 9 is etched away, the side etching amount on a wiring pattern (second wiring layer 12) can be minimized. Thus, the line width of the wire (second wiring layer 12) is not reduced.

Figure 1K:
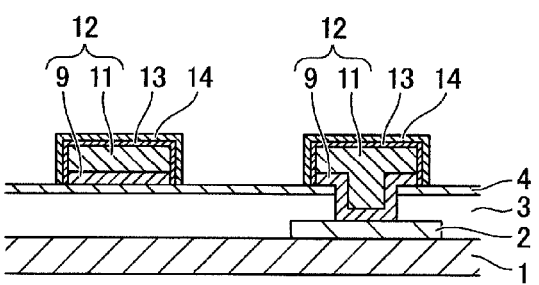

Then, as shown in FIG. 1K, a tin-plated layer 13 is formed by applying electroless plating treatment to the exposed surface of the second wiring layer 12, followed by forming a silane coupling layer 14 on the exposed surface of the tin-plated layer 13. In the present embodiment, this process is referred to as an eleventh step. The method of forming the silane coupling layer 14 need not be particularly limited. For example, materials may be immersed in an electrolytic bath prepared using an agent containing a silane coupling agent, followed by drying. Alternatively, materials may be sprayed with a chemical solution containing a silane coupling agent, followed by drying.

Figure 1L:
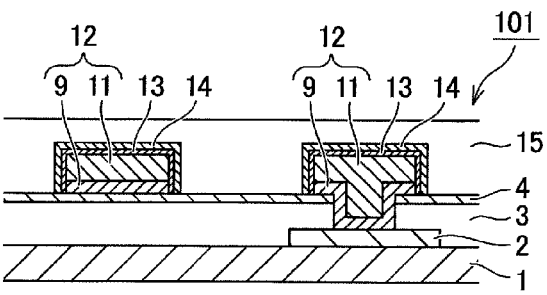

Then, as shown in FIG. 1L, a second insulating resin layer (second insulating layer) 15 is formed covering the second wiring layer 12 that includes the tin-plated layer 13 and the silane coupling layer 14. In the present embodiment, this process is referred to as a twelfth step. In this case, the second wiring layer 12, with its upper and side surfaces being provided with the tin-plated layer 13 and the silane coupling layer 14, can ensure adhesion to the second insulating resin layer 15. The method of forming the second insulating resin layer 15 need not be particularly limited. For example, a roll coater or a die coater can be preferably used.

In this manner, the printed wiring board 101 according to the present embodiment can be manufactured.

(Overall Configuration of Printed Wiring Board 101)

Referring to FIG. 1L, an overall configuration of the printed wiring board 101 manufactured through the process described above will be briefly described.

As shown in FIG. 1L, the printed wiring board 101 includes a laminate (core base material) and a built-up layer. The laminate is formed by laminating the first wiring layer 2 and the first insulating resin layer 3 in this order on the insulating substrate 1. The built-up layer is formed by laminating the second wiring layer 12 and the second insulating resin layer 15 in this order on the laminate. The primer layer 4 is formed between the second wiring layer 12 and the first insulating resin layer 3, and at least part of the lower surface of the second wiring layer 12 is in contact with the primer layer 4. The tin-plated layer 13 and the silane coupling layer 14 are formed in this order on the upper and side surfaces of the second wiring layer 12.

One of the two second wiring layers 12 shown in FIG. 1L is in electrical contact with the first wiring layer 2 while the other is not in electrical contact with the first wiring layer 2. The second wiring layer 12 is provided with the copper electroless-plated layer 9 and the copper electroplated layer 11 in this order from the first wiring layer 2 side.

(Advantageous Effects of First Embodiment)

In the above-described manufacturing process, the overall surface of the second wiring layer 12 is not roughened, and thus a wire (second wring layer 12) having a flat surface is formed. Therefore, a printed wiring board which reduces or prevents transmission delay of high-frequency signals can be provided.

In the above-described manufacturing process, the lower surface of the copper electroless-plated layer 9 is not roughened, and thus, compared to the case where the lower surface is roughened, etch removal of the copper electroless-plated layer 9 is finished in a short time. Therefore, the side etching amount of the second wiring layer 12 can be reduced, and thus a printed wiring board with a designed line width can be provided.

In the above-described manufacturing process, the surface of the first insulating resin layer 3 is not roughened even when applied with desmear treatment, and thus the second wiring layer 12, when formed on the first insulating resin layer 3 by a semi-additive method, will be a wire having no roughened surfaces. Furthermore, the tin-plated layer 13 and the silane coupling layer 14 which enhance adhesion with the second insulating resin layer 15 are formed in this order on the second wiring layer 12 to provide the state shown in FIG. 1A. Starting from this state, the steps shown in FIGS. 1B, 1C, 1D, 1E, 1F, 1G, 1H, 1I, 1J, 1K, and 1L are repeated to thereby manufacture a multilayer built-up wiring board.

In the multilayer built-up wiring board manufactured through the process described above, not only the upper and side surfaces of the wiring layer, but also the lower surface thereof is flat without asperities. This can provide a printed wiring board which reduces or prevents transmission delay of high-frequency signals in the wiring layer.

As described above, the resin layer contacting the lower surface of the wiring layer is not roughened and has a flat surface. Accordingly, the time taken for etch removal of the exposed wiring layer can be shortened. In addition, the width of the wiring layer is not reduced in the step of forming the wiring layer. Thus, a printed wiring board having a wiring layer with a designed line width can be formed.

Second Embodiment (Process of Manufacturing Printed Wiring Board 102)

Referring to FIGS. 2A, 2B, 2C, 2D, 2E, 2F, 2G, 2H, 2I, 2J, 2K, and 2L, a process of manufacturing a printed wiring board 102 according to a second embodiment of the present invention will be described.

The printed wiring board 102 according to the present embodiment includes a wiring layer formed on an insulating substrate 1 using a semi-additive method. In the first embodiment, two layers, i.e., a tin-plated layer 13 and a silane coupling layer 14, are formed on the exposed surface of the second wiring layer 12. The second embodiment is different from the first embodiment in that a silane coupling layer 14 alone is formed on the exposed surface. A process of manufacturing the printed wiring board 102 according to the present embodiment will be specifically described. Treatments and the like are substantially the same as those of the first embodiment.

First, as shown in FIG. 1A, a first wiring layer 2 is formed on the insulating substrate 1, and then a first insulating resin layer 3 is formed covering the first wiring layer 2. In the present embodiment, this process is referred to as a first step.

Figure 2A:
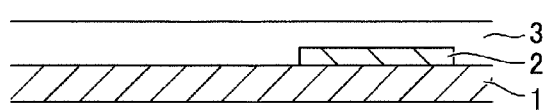
FIGS. 2A, 2B, 2C, 2D, 2E, 2F, 2G, 2H, 2I, 2J, 2K, and 2L is a set of schematic cross sections illustrating a flow of manufacturing a printed wiring board according to a second embodiment of the present invention.
Figure 2B:
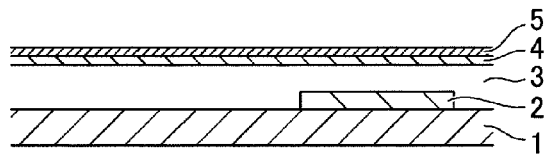

Then, as shown in FIG. 2B, a primer layer 4 is formed on the first insulating resin layer 3, and a copper layer 5 is formed on the primer layer 4. In the present embodiment, this process is referred to as a second step.

The copper layer 5 on the primer layer 4 may be a layer formed, for example, by pressure joining of copper foil, or may be an electroless copper plated layer formed by electroless plating, or may be a thin copper layer formed by sputtering, vacuum deposition, or the like. Instead of forming the primer layer 4 and the copper layer 5 in this order on the first insulating resin layer 3, a copper layer 5 provided with a primer layer 4 may be pressure-joined to the first insulating resin layer 3 such that the surface provided with the primer layer 4 faces the first insulating resin layer 3.

Any material may be used for the primer layer 4 as long as the material ensures adhesion between the first insulating resin layer 3 and the copper layer (copper foil) 5. Examples of such a material include materials containing an epoxy resin, a polyimide resin, or a polyamide resin. The primer layer 4 preferably has a dry thickness of 3 μm or less. The copper layer 5 preferably has a thickness of 3 μm or less.

Figure 2C:
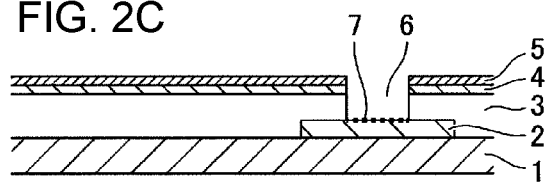

Then, as shown in FIG. 2C, via holes 6 are formed such as by laser irradiation, penetrating the copper layer 5, the primer layer 4, and the first insulating resin layer 3 to expose the surface of the first wiring layer 2. In the present embodiment, this process is referred to as a third step. In this case, smears 7, which are residues of the insulating resin generated by laser irradiation, remain on the bottom surfaces of the via holes 6, or the sidewall surfaces (inner surfaces) thereof.

Figure 2D:
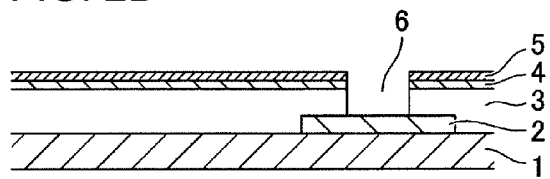

Then, as shown in FIG. 2D, the smears 7 are removed by desmear treatment. In the present embodiment, this process is referred to as a fourth step. In the present embodiment, the surface of the first insulating resin layer 3 is not roughened even when the desmear treatment is applied because the surface is at least covered with the copper layer (copper foil) 5.

Figure 2E:
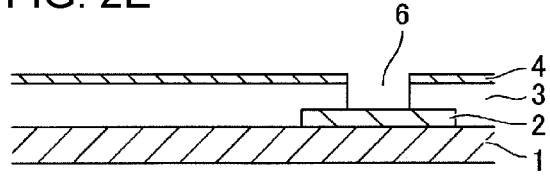

Then, as shown in FIG. 2E, the copper layer (copper foil) 5 is removed to expose the surface of the primer layer 4. In the present embodiment, this process is referred to as a fifth step.

Figure 2F:
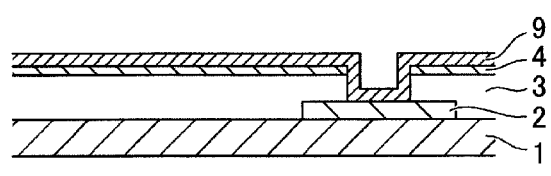

Then, as shown in FIG. 2F, an electroless copper plated layer 9 is formed by electroless plating to cover the bottom surfaces of the via holes 6, the sidewall surfaces thereof, and the surface of the primer layer 4. In the present embodiment, this process is referred to as a sixth step.

Figure 2G:
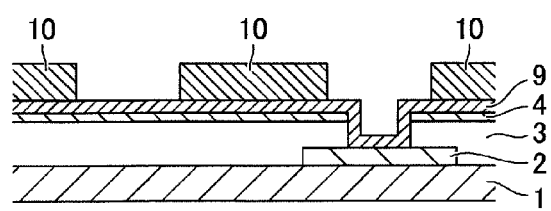

Then, as shown in FIG. 2G, a resist pattern 10 is formed on the copper electroless-plated layer 9 to cover non-wiring portions. In the present embodiment, this process is referred to as a seventh step.

Figure 2H:
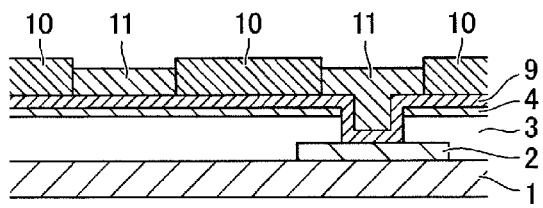

Then, as shown in FIG. 2H, a copper electroplated layer 11 is formed by copper electroplating on the copper electroless-plated layer 9 on which the resist pattern 10 is formed. In the present embodiment, this process is referred to as an eighth step.

Figure 2I:
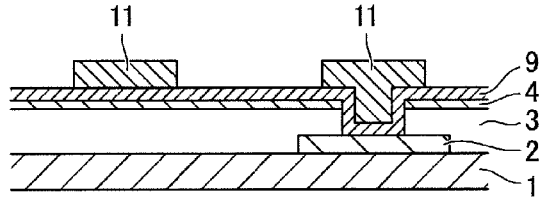

Then, as shown in FIG. 2I, the resist pattern 10 is removed using the resist stripping liquid. In the present embodiment, this process is referred to as a ninth step.

Figure 2J:
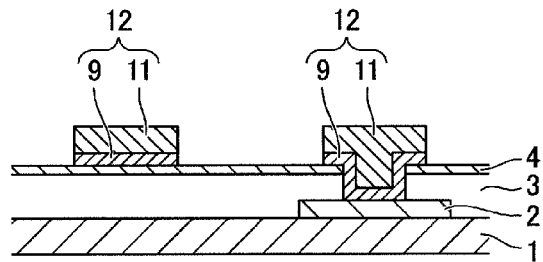

Then, as shown in FIG. 2J, the copper electroless-plated layer 9 is etched away at portions where the surface has been exposed, that is, portions empty of the resist pattern 10, thereby forming a second wiring layer 12 including the copper electroless-plated layer 9 and the copper electroplated layer 11. In the present embodiment, this process is referred to as a tenth step.

In this case, since the lower surface of the copper electroless-plated layer 9 is not roughened, etching time does not need to be increased to completely remove the copper in the concavities, unlike when etching away copper caught in the concavities of a roughened surface. Thus, the line width of the wire (second wiring layer 12) is not reduced.

Figure 2K:
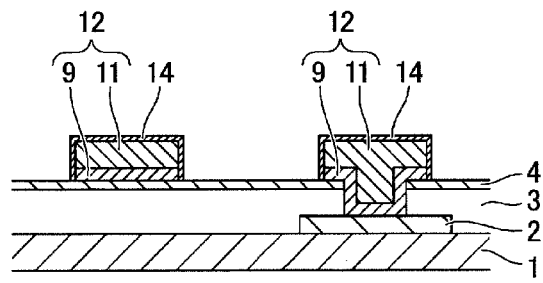

Then, as shown in FIG. 2K, a silane coupling layer 14 is formed on the exposed surface of the second wiring layer 12. In the present embodiment, this process is referred to as an eleventh step.

Figure 2L:
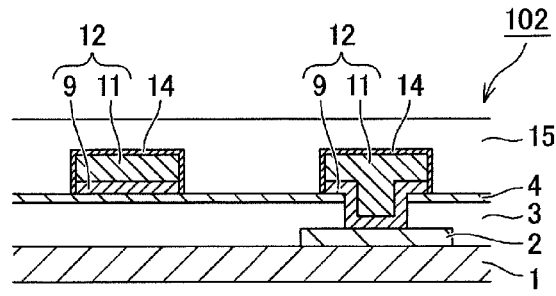

Then, as shown in FIG. 2L, a second insulating resin layer 15 is formed covering the second wiring layer 12 that includes the silane coupling layer 14. In the present embodiment, this process is referred to as a twelfth step. In this case, the second wiring layer 12, with its upper and side surfaces being provided with the silane coupling layer 14, can ensure adhesion to the second insulating resin layer 15.

In this manner, the printed wiring board 102 according to the present embodiment is manufactured.

(Overall Configuration of Printed Wiring Board 102)

An overall configuration of the printed wiring board 102 manufactured through the process described above will be briefly described.

As shown in FIG. 2L, the printed wiring board 102 includes a laminate (core base material) and a built-up layer. The laminate is formed by laminating the first wiring layer 2 and the first insulating resin layer 3 in this order on the insulating substrate 1. The built-up layer is formed by laminating the second wiring layer 12 and the second insulating resin layer 15 in this order on the laminate. The primer layer 4 is formed between the second wiring layer 12 and the first insulating resin layer 3, and at least part of the lower surface of the second wiring layer 12 is in contact with the primer layer 4. The silane coupling layer 14 is formed on the upper and side surfaces of the second wiring layer 12.

One of the two second wiring layers 12 shown in FIG. 2L is in electrical contact with the first wiring layer 2 while the other is not in electrical contact with the first wiring layer 2. The second wiring layer 12 is provided with the copper electroless-plated layer 9 and the copper electroplated layer 11 in this order from the first wiring layer 2 side.

(Advantageous Effects of Second Embodiment)

In the above-described manufacturing process, the surface of the first insulating resin layer 3 is not roughened even when applied with desmear treatment, and thus the second wiring layer 12, when formed on the first insulating resin layer 3 by a semi-additive method, will be a wire having no roughened surfaces. Furthermore, the silane coupling layer 14 which enhances adhesion with the second insulating resin layer 15 is formed on the second wiring layer 12 to provide the state shown in FIG. 2A. Starting from this state, the steps shown in FIGS. 2B, 2C, 2D, 2E, 2F, 2G, 2H, 2I, 2J, 2K, and 2L are repeated to thereby manufacture a multilayer built-up wiring board.

In the multilayer built-up wiring board manufactured through the process described above, not only the upper and side surfaces of the wiring layer, but also the lower surface thereof is flat without asperities. This can provide a printed wiring board which reduces or prevents transmission delay of high-frequency signals in the wiring layer.

Furthermore, since the resin layer contacting the lower surface of the wiring layer is not roughened and has a flat surface, the time taken for etch removal of the exposed wiring layer can be shortened. In addition, the width of the wiring layer is not reduced in the step of forming the wiring layer. Thus, a printed wiring board having a wiring layer with a designed line width can be formed.

In the present embodiment, the silane coupling layer 14 ensures adhesion between the second wiring layer 12 and the second insulating resin layer 15. Thus, the step of forming a tin-plated layer 13, which is needed in the first embodiment, can be omitted. Omitting this forming step, the number of manufacturing steps is reduced, and the multilayer built-up wiring board can be manufactured at low cost.

Third Embodiment (Process of Manufacturing Printed Wiring Board 103)

Referring to FIGS. 3A, 3B, 3C, 3D, 3E, 3F, 3G, 3H, 3I, 3J, and 3K, a process of manufacturing a printed wiring board 103 according to a third embodiment of the present invention will be described.

The printed wiring board 103 according to the present embodiment includes a wiring layer formed on an insulating substrate 1 using a semi-additive method. In the first embodiment, two layers, the tin primer layer 4 and the copper layer 5, are formed on the first insulating resin layer 3. The third embodiment is different from the first embodiment in that only a primer layer 4 is formed on the first insulating resin layer 3. A process of manufacturing the printed wiring board 103 according to the present embodiment will be specifically described below. Treatments and the like are substantially the same as those of the first embodiment.

Figure 3A:
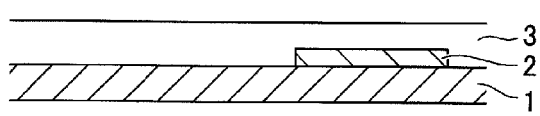
FIGS. 3A, 3B, 3C, 3D, 3E, 3F, 3G, 3H, 3I, 3J, and 3K is a set of schematic cross sections illustrating a flow of manufacturing a printed wiring board according to a third embodiment of the present invention.

First, as shown in FIG. 3A, a first wiring layer 2 is formed on the insulating substrate 1, and then a first insulating resin layer 3 is formed covering the first wiring layer 2. In the present embodiment, this process is referred to as a first step.

Figure 3B:
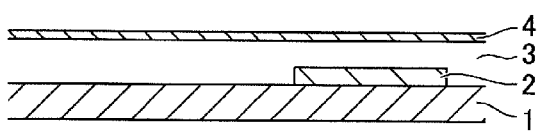

Then, as shown in FIG. 3B, a primer layer 4 is formed on the first insulating resin layer 3. In the present embodiment, this process is referred to as a second step.

Any material may be used for the primer layer 4 as long the material ensures adhesion between the first insulating resin layer 3 and the copper electroless-plated layer 9. Examples of such a material include materials containing an epoxy resin, a polyimide resin, or a polyamide resin. The primer layer 4 preferably has a dry thickness of 3 μm or less.

Figure 3C:
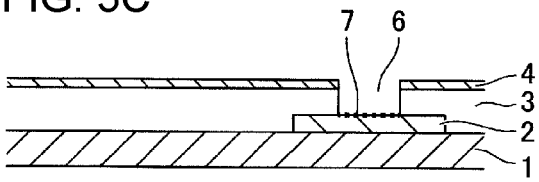

Then, as shown in FIG. 3C, via holes 6 are formed such as by laser irradiation, penetrating the primer layer 4, and the first insulating resin layer 3 to expose the surface of the first wiring layer 2. In the present embodiment, this process is referred to as a third step. In this case, smears 7, which are residues of the insulating resin generated by laser irradiation, remain on the bottom surfaces of the via holes 6, or the sidewall surfaces (inner surfaces) thereof.

Figure 3D:
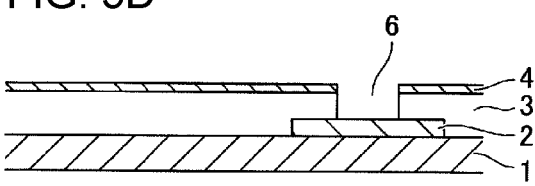

Then, as shown in FIG. 3D, the smears 7 are removed by desmear treatment. In the present embodiment, this process is referred to as a fourth step. The primer layer 4 is thinned by 0.5 to 2 μm by being etched in the desmear treatment. However, the primer layer 4, with its surface not being roughened, remains thick enough to ensure adhesion of the copper electroless-plated layer 9.

Figure 3E:
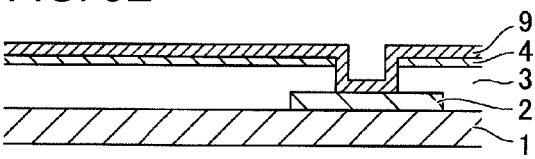

Then, as shown in FIG. 3E, an electroless copper plated layer 9 is formed by electroless plating to cover the bottom surfaces of the via holes 6, the sidewall surfaces thereof, and the surface of the primer layer 4. In the present embodiment, this process is referred to as a fifth step.

Figure 3F:
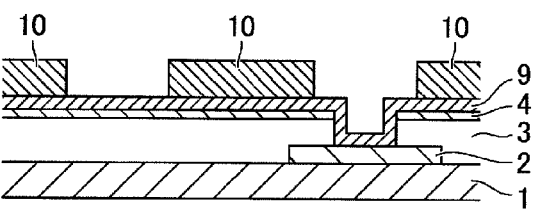

Then, as shown in FIG. 3F, a resist pattern 10 is formed on the copper electroless-plated layer 9 to cover non-wiring portions. In the present embodiment, this process is referred to as a sixth step.

Figure 3G:
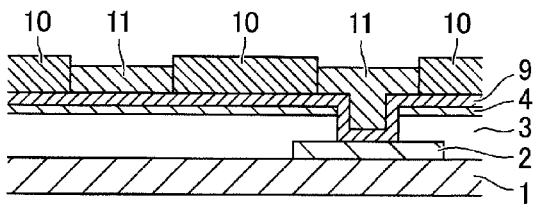

Then, as shown in FIG. 3G, a copper electroplated layer 11 is formed by copper electroplating on the copper electroless-plated layer 9 on which the resist pattern 10 is formed. In the present embodiment, this process is referred to as a seventh step.

Figure 3H:
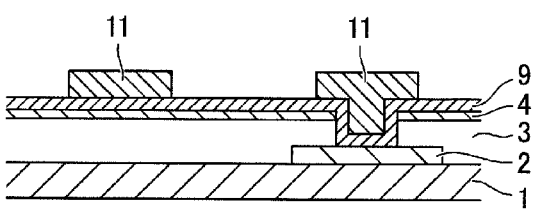

Then, as shown in FIG. 3H, the resist pattern 10 is removed using the resist stripping liquid. In the present embodiment, this process is referred to as an eighth step.

Figure 3I:
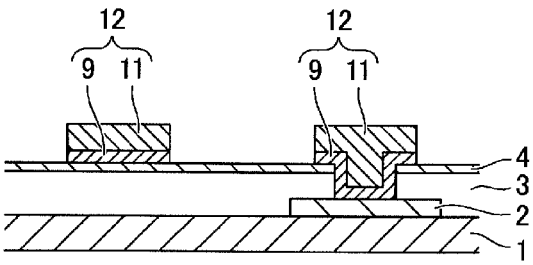

Then, as shown in FIG. 3I, the copper electroless-plated layer 9 is etched away at portions where the surface has been exposed, that is, portions empty of the resist pattern 10, thereby forming a second wiring layer 12 including the copper electroless-plated layer 9 and the copper electroplated layer 11. In the present embodiment, this process is referred to as a ninth step.

In this case, since the lower surface of the copper electroless-plated layer 9 is not roughened, etching time does not need to be increased to completely remove the copper in the concavities, unlike when etching away copper caught in the concavities of a roughened surface. Thus, the line width of the wire (second wiring layer 12) is not reduced.

Figure 3J:
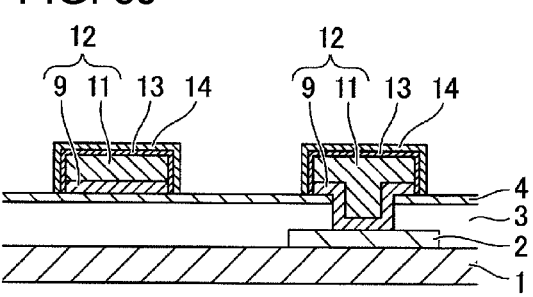

Then, as shown in FIG. 3J, a tin-plated layer 13 is formed by applying electroless plating treatment to the exposed surface of the second wiring layer 12, followed by forming a silane coupling layer 14 on the exposed surface of the tin-plated layer 13. In the present embodiment, this process is referred to as a tenth step. The method of forming the silane coupling layer 14 need not be particularly limited. For example, materials may be immersed in an electrolytic bath prepared using an agent containing a silane coupling agent, followed by drying. Alternatively, materials may be sprayed with a chemical solution containing a silane coupling agent, followed by drying.

Figure 3K:
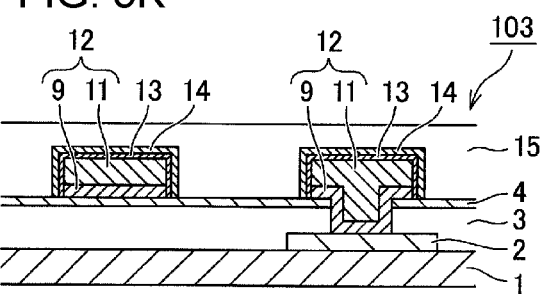

Then, as shown in FIG. 3K, a second insulating resin layer 15 is formed covering the second wiring layer 12 that includes the tin-plated layer 13 and the silane coupling layer 14. In the present embodiment, this process is referred to as an eleventh step. In this case, the second wiring layer 12, with its upper and side surfaces being provided with the tin-plated layer 13 and the silane coupling layer 14, can ensure adhesion to the second insulating resin layer 15. The method of forming the second insulating resin layer 15 need not be particularly limited. For example, a roll coater or a die coater can be preferably used.

In this manner, the printed wiring board 103 according to the present embodiment is manufactured.

(Overall Configuration of Printed Wiring Board 103)

An overall configuration of the printed wiring board 103 manufactured through the process described above will be briefly described.

As shown in FIG. 3K, the printed wiring board 103 includes a laminate (core base material) and a built-up layer. The laminate is formed by laminating the first wiring layer 2 and the first insulating resin layer 3 in this order on the insulating substrate 1. The built-up layer is formed by laminating the second wiring layer 12 and the second insulating resin layer 15 in this order on the laminate. The primer layer 4 is formed between the second wiring layer 12 and the first insulating resin layer 3, and at least part of the lower surface of the second wiring layer 12 is in contact with the primer layer 4. The tin-plated layer 13 and the silane coupling layer 14 are formed in this order on the upper and side surfaces of the second wiring layer 12.

One of the two second wiring layers 12 shown in FIG. 3K is in electrical contact with the first wiring layer 2 while the other is not in electrical contact with the first wiring layer 2. The second wiring layer 12 is provided with the copper electroless-plated layer 9 and the copper electroplated layer 11 in this order from the first wiring layer 2 side.

(Advantageous Effects of Third Embodiment)

In the above-described manufacturing process, the overall surface of the second wiring layer 12 is not roughened, and thus a wire (second wring layer 12) having a flat surface is formed. Therefore, a printed wiring board which reduces or prevents transmission delay of high-frequency signals can be provided.

In the above-described manufacturing process, the lower surface of the copper electroless-plated layer 9 is not roughened, and thus, compared to the case where the lower surface is roughened, etch removal of the copper electroless-plated layer 9 is finished in a short time. Therefore, the side etching amount of the second wiring layer 12 can be reduced, and thus a printed wiring board with a designed line width can be provided.

In the above-described manufacturing process, the surface of the first insulating resin layer 3 is not roughened even when applied with desmear treatment, and thus the second wiring layer 12, when formed on the first insulating resin layer 3 by a semi-additive method, will be a wire having no roughened surfaces. Furthermore, the tin-plated layer 13 and the silane coupling layer 14 which enhances adhesion with the second insulating resin layer 15 are formed in this order on the second wiring layer 12 to provide the state shown in FIG. 3A. Starting from this state, the steps shown in FIGS. 3B, 3C, 3D, 3E, 3F, 3G, 3H, 3I, 3J, and 3K are repeated to thereby manufacture a multilayer built-up wiring board.

In the multilayer built-up wiring board manufactured through the process described above, not only the upper and side surfaces of the wiring layer, but also the lower surface thereof is flat without asperities. This can provide a printed wiring board which reduces or prevents transmission delay of high-frequency signals in the wiring layer.

As described above, the resin layer contacting the lower surface of the wiring layer is not roughened and has a flat surface. Accordingly, the time taken for etch removal of the exposed wiring layer can be shortened. In addition, the width of the wiring layer is not reduced in the step of forming the wiring layer. Thus, a printed wiring board having a wiring layer with a designed line width can be formed.

The present embodiment, which uses the primer layer 4 that is not roughened in the desmear treatment, can omit the step of forming the copper layer (copper foil) 5 for preventing roughening due to the desmear treatment used in the first embodiment. Accordingly, the step of removing the copper layer 5 can also be omitted. Omitting these forming steps, the number of manufacturing steps is reduced, and the multilayer built-up wiring board can be manufactured at low cost.

Fourth Embodiment (Process of Manufacturing Printed Wiring Board 104)

Referring to FIGS. 4A, 4B, 4C, 4D, 4E, 4F, 4G, 4H, 4I, 4J, and 4K, a process of manufacturing a printed wiring board 104 according to a fourth embodiment of the present invention will be described.

The printed wiring board 104 according to the present embodiment includes a wiring layer formed on an insulating substrate 1 using a semi-additive method. In the third embodiment, two layers, i.e., a tin-plated layer 13 and a silane coupling layer 14, are formed on the exposed surface of the second wiring layer 12. The fourth embodiment is different from the third embodiment in that only a silane coupling layer 14 is formed on the exposed surface. A process of manufacturing the printed wiring board 104 according to the present embodiment will be specifically described below. The processing of treatments and the like are substantially the same as those of the third embodiment.

Figure 4A:
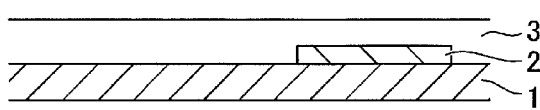
FIGS. 4A, 4B, 4C, 4D, 4E, 4F, 4G, 4H, 4I, 4J, and 4K is a set of schematic cross sections illustrating a flow of manufacturing a printed wiring board according to a fourth embodiment of the present invention.

First, as shown in FIG. 4A, a first wiring layer 2 is formed on the insulating substrate 1, and then a first insulating resin layer 3 is formed covering the first wiring layer 2. In the present embodiment, this process is referred to as a first step.

Figure 4B:
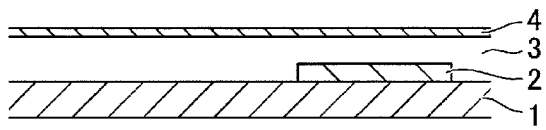

Then, as shown in FIG. 4B, a primer layer 4 is formed on the first insulating resin layer 3. In the present embodiment, this process is referred to as a second step.

Any material may be used for the primer layer 4 as long the material ensures adhesion between the first insulating resin layer 3 and the copper electroless-plated layer 9. Examples of such a material include materials containing an epoxy resin, a polyimide resin, or a polyamide resin. The primer layer 4 preferably has a dry thickness of 3 μm or less.

Figure 4C:
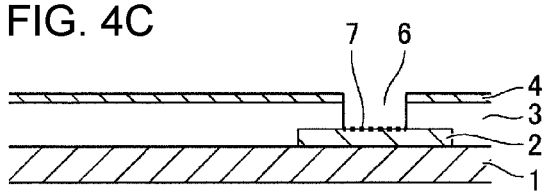

Then, as shown in FIG. 4C, via holes 6 are formed such as by laser irradiation, penetrating the primer layer 4, and the first insulating resin layer 3 to expose the surface of the first wiring layer 2. In the present embodiment, this process is referred to as a third step. In this case, smears 7, which are residues of the insulating resin generated by laser irradiation, remain on the bottom surfaces of the via holes 6, or the sidewall surfaces (inner surfaces) thereof.

Figure 4D:
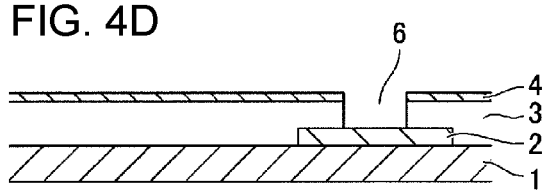

Then, as shown in FIG. 4D, the smears 7 are removed by desmear treatment. In the present embodiment, this process is referred to as a fourth step. The primer layer 4 is thinned by 0.5 to 2 μm by being etched in the desmear treatment. However, the primer layer 4, with its surface not being roughened, remains thick enough to ensure adhesion of the copper electroless-plated layer 9.

Figure 4E:
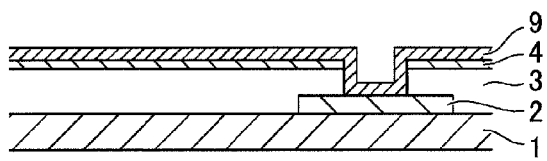

Then, as shown in FIG. 4E, an electroless copper plated layer 9 is formed by electroless plating to cover the bottom surfaces of the via holes 6, the sidewall surfaces thereof, and the surface of the primer layer 4. In the present embodiment, this process is referred to as a fifth step.

Figure 4F:
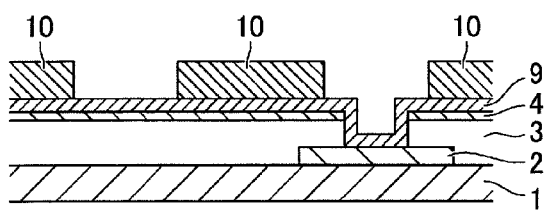

Then, as shown in FIG. 4F, a resist pattern 10 is formed on the copper electroless-plated layer 9 to cover non-wiring portions. In the present embodiment, this process is referred to as a sixth step.

Figure 4G:
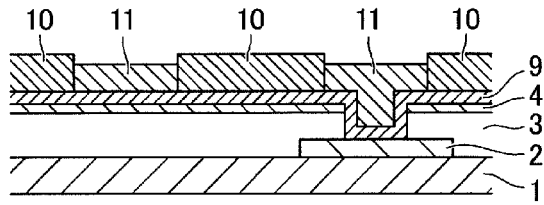

Then, as shown in FIG. 4G, a copper electroplated layer 11 is formed by copper electroplating on the copper electroless-plated layer 9 on which the resist pattern 10 is formed. In the present embodiment, this process is referred to as a seventh step.

Figure 4H:
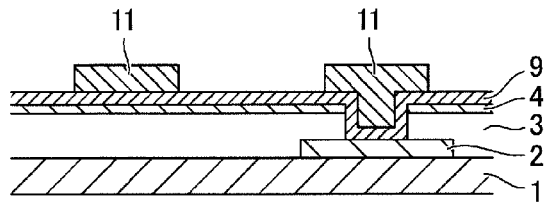

Then, as shown in FIG. 4H, the resist pattern 10 is removed using the resist stripping liquid. In the present embodiment, this process is referred to as an eighth step.

Figure 4I:
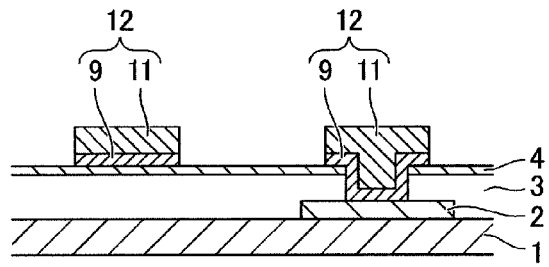

Then, as shown in FIG. 4I, the copper electroless-plated layer 9 is etched away at portions where the surface has been exposed, that is, portions empty of the resist pattern 10, thereby forming a second wiring layer 12 including the copper electroless-plated layer 9 and the copper electroplated layer 11. In the present embodiment, this process is referred to as a ninth step.

In this case, since the lower surface of the copper electroless-plated layer 9 is not roughened, etching time does not need to be increased to completely remove the copper in the concavities, unlike when etching away copper caught in the concavities of a roughened surface. Thus, the line width of the wire (second wiring layer 12) is not reduced.

Figure 4J:
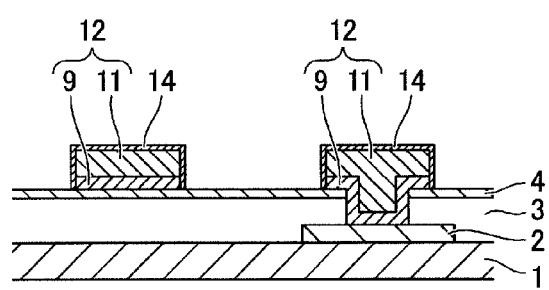

Then, as shown in FIG. 4J, a silane coupling layer 14 is formed on the exposed surface of the second wiring layer 12. In the present embodiment, this process is referred to as a tenth step.

Figure 4K:
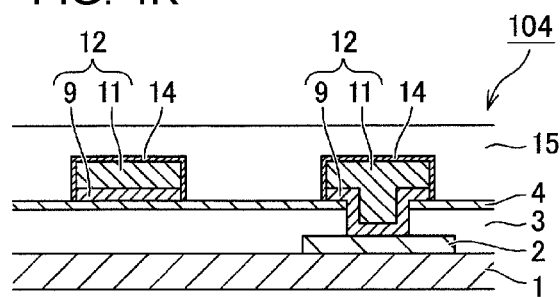

Then, as shown in FIG. 4K, a second insulating resin layer 15 is formed covering the second wiring layer 12 that includes the silane coupling layer 14. In the present embodiment, this process is referred to as an eleventh step. In this case, the second wiring layer 12, with its upper and side surfaces being provided with the silane coupling layer 14, can ensure adhesion to the second insulating resin layer 15.

In this manner, the printed wiring board 104 according to the present embodiment is manufactured.

(Overall Configuration of Printed Wiring Board 104)

An overall configuration of the printed wiring board 104 manufactured through the process described above will be briefly described.

As shown in FIG. 4K, the printed wiring board 101 includes a laminate (core base material) and a built-up layer. The laminate is formed by laminating the first wiring layer 2 and the first insulating resin layer 3 in this order on the insulating substrate 1. The built-up layer is formed by laminating the second wiring layer 12 and the second insulating resin layer 15 in this order on the laminate. The primer layer 4 is formed between the second wiring layer 12 and the first insulating resin layer 3, and at least part of the lower surface of the second wiring layer 12 is in contact with the primer layer 4. The silane coupling layer 14 is formed on the upper and side surfaces of the second wiring layer 12.

One of the two second wiring layers 12 shown in FIG. 4K is in electrical contact with the first wiring layer 2 while the other is not in electrical contact with the first wiring layer 2. The second wiring layer 12 is provided with the copper electroless-plated layer 9 and the copper electroplated layer 11 in this order from the first wiring layer 2 side.

(Advantageous Effects of Fourth Embodiment)

In the above-described manufacturing process, the surface of the first insulating resin layer 3 is not roughened even when applied with desmear treatment, and thus the second wiring layer 12, when formed on the first insulating resin layer 3 by a semi-additive method, will be a wire having no roughened surfaces. Furthermore, the silane coupling layer 14 which enhances adhesion with the second insulating resin layer 15 is formed on the second wiring layer 12 to provide the state shown in FIG. 4A. Starting from this state, the steps shown in FIGS. 4B, 4C, 4D, 4E, 4F, 4G, 4H, 4I, 4J, and 4K are repeated to thereby manufacture a multilayer built-up wiring board.

In the multilayer built-up wiring board manufactured through the process described above, not only the upper and side surfaces of the wiring layer, but also the lower surface thereof is flat without asperities. This can provide a printed wiring board which reduces or prevents transmission delay of high-frequency signals in the wiring layer.

Furthermore, since the resin layer contacting the lower surface of the wiring layer is not roughened and has a flat surface, the time taken for etch removal of the exposed wiring layer can be shortened. In addition, the width of the wiring layer is not reduced in the step of forming the wiring layer. Thus, a printed wiring board having a wiring layer with a designed line width can be formed.

The present embodiment, which uses the primer layer 4 that is not roughened in the desmear treatment, can omit the step of forming the copper layer (copper foil) 5 for preventing roughening due to the desmear treatment used in the first embodiment. Accordingly, the step of removing the copper layer 5 can also be omitted. Omission of these forming steps can reduce the number of manufacturing steps and the manufacturing cost of the multilayer built-up wiring board.

In the present embodiment, use of only the silane coupling layer 14 can ensure adhesion between the second wiring layer 12 and the second insulating resin layer 15. Thus, the step of forming a tin-plated layer 13, which is needed in the third embodiment, can be omitted. Omission of this forming step can shorten the manufacturing process and reduce the manufacturing cost of the multilayer built-up wiring board.

(Advantageous Effects of Embodiments)

As described above, in the methods of manufacturing the printed wiring boards 101 to 104 according to the embodiments and the printed wiring boards 101 to 104 manufactured by these manufacturing methods, not only the upper and side surfaces of the second wiring layer 12, but also the lower surface of the second wiring layer 12 can be made flat without asperities. Thus, there can be provided methods of manufacturing the printed wiring boards 101 to 104 reducing or preventing transmission delay of high-frequency signals in the second wiring layer 12, and the printed wiring boards 101 to 104 manufactured by these manufacturing methods.

Furthermore, since the surface of the primer layer 4 contacting the lower surface of the second wiring layer 12 is not roughened, but is flat, the time taken for etch removal of the exposed second wiring layer 12 can be shortened, and at the same time, the width of the second wiring layer 12 is not reduced at the step of forming the second wiring layer 12. Thus, there can be provided methods of manufacturing printed wiring boards each including the second wiring layer 12 with a designed line width, and the printed wiring boards 101 to 104 manufactured by these manufacturing methods.

In other words, the methods of manufacturing the printed wiring boards 101 to 104 according to the embodiments and the printed wiring boards 101 to 104 manufactured by these manufacturing methods can solve the signal delay problem of high-frequency signals, and shorten the time for etching a seed layer (the copper electroless-plated layer serving as a base conductive layer for pattern copper electroplating), and prevents the width of the wiring layer from being reduced by the pattern copper electroplating at the step of forming the wiring layer.

(Modifications of Embodiments)

Figure 5A:
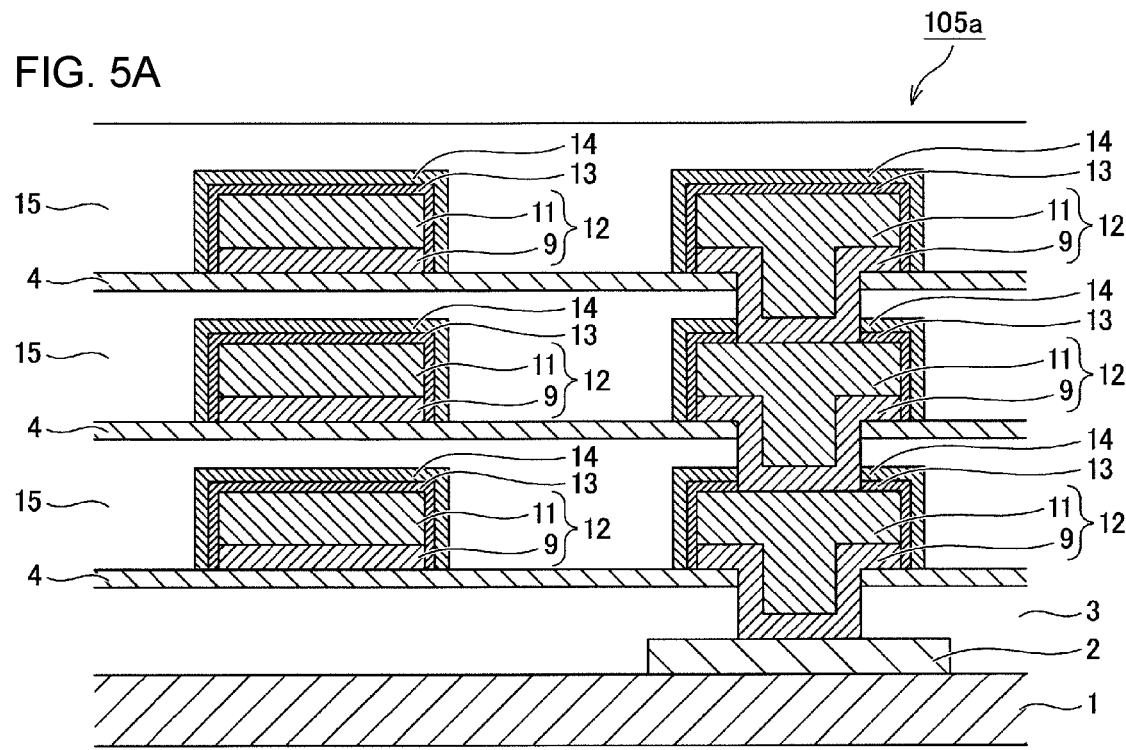
FIGS. 5A and 5B is a set of schematic cross sections illustrating configurations according to modifications of the printed wiring boards of the embodiments of the present invention.
Figure 5B:
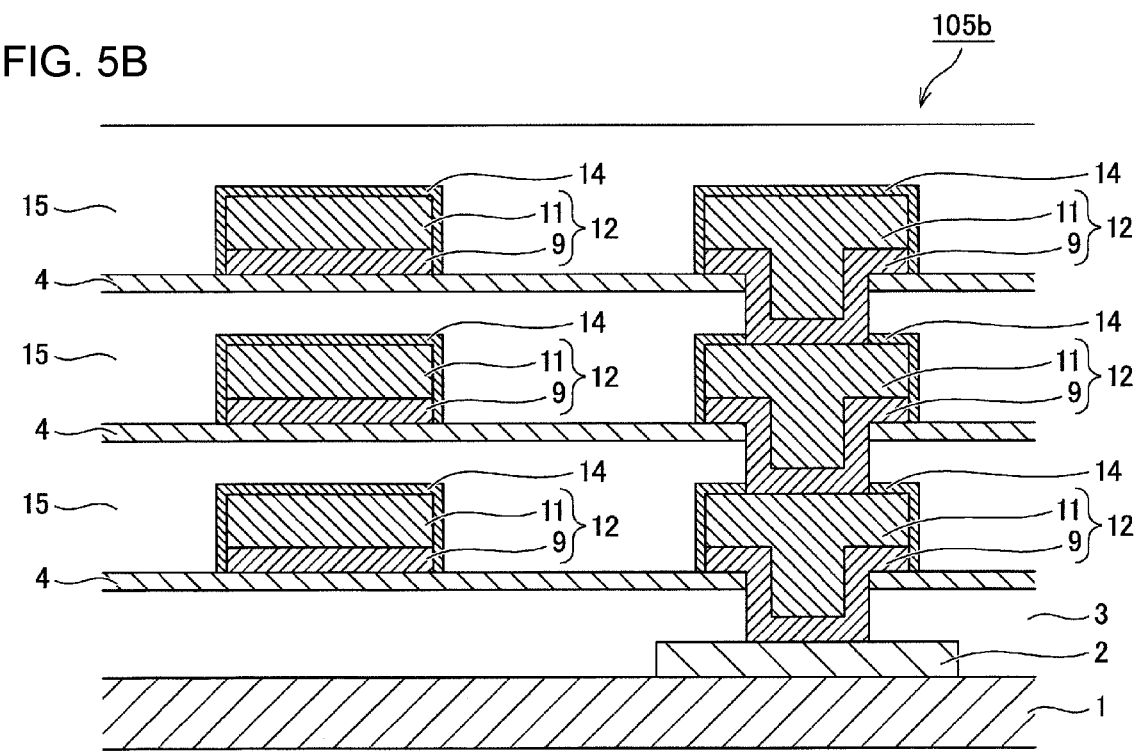

Referring to FIGS. 5A and 5B, modifications of the above embodiments will be briefly described.

FIGS. 5A and 5B are a set of diagrams illustrating schematic cross sections of configurations according to modifications of the printed wiring boards 101 to 104 of the embodiments of the present invention. The printed wiring boards 101 to 104 of the respective embodiments include only one second wring layer 12, but the present invention is not limited to such embodiments. For example, as shown in FIG. 5A and FIG. 5B, more than one second wiring layer 12 may be provided. Specifically, in printed wiring boards 105a and 105b according to modes of modifications of the above embodiments, wiring layers and insulating layers are alternately laminated on the insulating substrate 1, with a primer layer 4 being formed on at least one of the laminated insulating layers, and with a wiring layer being formed on at least one of the primer layers 4. At least part of the lower surface of the wiring layer formed on the primer layer 4 is in contact with the primer layer 4. In the printed wiring board 105a shown in FIG. 5A, a tin-plated layer 13 and a silane coupling layer 14 are formed in this order on the upper and side surfaces of each wiring layer. In the printed wiring board 105b shown in FIG. 5B, only a silane coupling layer 14 is formed on the upper and side surfaces of each wiring layer. Stated differently, the printed wiring board 105a shown in FIG. 5A is a multilayer built-up wiring board formed, for example, by repeating the steps shown in FIGS. 1B, 1C, 1D, 1E, 1F, 1G, 1H, 1I, 1J, 1K, and 1L, starting from the formation state shown in FIG. 1A. The printed wiring board 105b shown in FIG. 5B is a multilayer built-up wiring board formed, for example, by repeating the steps shown in FIGS. 2B, 2C, 2D, 2E, 2F, 2G, 2H, 2I, 2J, 2K, and 2L, starting from the formation state shown in FIG. 2A.

EXAMPLES

First Example

A first example of the present invention will be described.

First, as shown in FIG. 1A, a first wiring layer 2 was formed on an insulating substrate 1, and then a first insulating resin layer 3 was formed covering the first wiring layer 2. To obtain this configuration, a core base material was prepared by patterning copper foil of a one-sided FR-4 glass epoxy plate (having a copper foil thickness of 12 μm) and forming a first wiring layer 2. Then, a first insulating resin layer 3 was applied to the first wiring layer 2 of the prepared core base material, followed by drying. The copper foil was patterned through a generally used process of manufacturing a printed wiring board. The material used for the first insulating resin layer 3 was an interlayer insulating film ABF-GX13 (having a thickness of 25 μm manufactured by Ajinomoto Fine-Techno Co., Inc.). The first insulating resin layer 3 was formed by laminating this material.

Then, as shown in FIG. 1B, copper foil 5 (having a thickness of 3 μm) adhered with the primer layer 4 (having a thickness of 3 μm) was pressure-joined onto the first insulating resin layer 3.

Then, as shown in FIG. 1C, via holes 6 were formed such as by laser irradiation, penetrating the copper foil 5, the primer layer 4, and the first insulating resin layer 3 to expose the surface of the first wiring layer 2. At this step, the via holes each 6 having a diameter of 100 μm were formed using a CO2 laser drill SLR-400T (manufactured by Sumiton Heavy Industries, Ltd.) for printed wiring board. In this case, smears 7 generated by the laser irradiation remained on the bottom surfaces of the via holes 6 (the exposed surface of the first wiring layer 2).

Therefore, as shown in FIG. 1D, the smears 7 were removed by desmear treatment. The desmear treatment was a permanganic desmear process used in an ordinary manufacturing process of printed wiring boards.

Then, as shown in FIG. 1E, the copper layer 5 was removed to expose the surface of the primer layer 4. The copper foil 5 was removed using a copper etching device which used a sulfuric acid/hydrogen peroxide-based etching solution.

Then, as shown in FIG. 1F, an electroless copper plated layer 9 was formed by electroless plating to cover the bottom surfaces of the via holes 6, the sidewall surfaces thereof, and the surface of the primer layer 4.

Then, as shown in FIG. 1G, a resist pattern 10 was formed on the copper electroless-plated layer 9 to cover non-wiring portions. The resist pattern 10 was formed by photolithography of using a negative dry film that was used in an ordinary process of manufacturing printed wiring boards.

Then, as shown in FIG. 1H, a copper electroplated layer 11 was formed by copper electroplating on the copper electroless-plated layer 9 on which the resist pattern 10 is formed. The copper electroplating was performed using a copper sulfate electroplating device that was used in an ordinary process of manufacturing printed wiring boards. The thickness of the copper electroplated layer 11 was set to 12±2 μm.

Then, as shown in FIG. 1I, the resist pattern 10 was removed using the resist stripping liquid. The resist pattern 10 was stripped through a dry film pattern resist stripping step used in an ordinary process of manufacturing printed wiring boards.

Then, as shown in FIG. 1J, the copper electroless-plated layer 9 was etched away at portions where the surface had been exposed, thereby forming a second wiring layer 12 including the copper electroless-plated layer 9 and the copper electroplated layer 11. For etch removal of the copper electroless-plated layer 9, an ammonium persulfate-based etching solution was used.

Thus, micro wiring with a line and space pattern of 10±2 μm was easily formed.

Then, as shown in FIG. 1K, a tin-plated layer 13 was formed by applying electroless plating treatment to the exposed surface of the second wiring layer 12. Then, a silane coupling layer 14 was formed on the exposed surface of the tin-plated layer 13. The silane coupling layer 14 was formed by immersing materials in a treatment bath that used the silane coupling agent FC-9100 (manufactured by MEC Co., Ltd), followed by hot air drying.

Then, as shown in FIG. 1L, a second insulating resin layer 15 was formed covering the second wiring layer 12 that included the tin-plated layer 13 and the silane coupling layer 14. The material used for the second insulating resin layer 15 was an interlayer insulating film ABF-GX13 (having a thickness of 25 μm manufactured by Ajinomoto Fine-Techno Co., Inc.). The second insulating resin layer 15 was formed by laminating this material.

The multilayer built-up wiring board manufactured as described above achieved good adhesion between the second insulating resin layer 15, the second wiring layer 12, and the first wiring layer 2, and also achieved high-speed signal transmission and a very small line width with the wiring layer.

Second Example

A second example of the present invention will be described.

In the first example, as shown in FIG. 1K, a tin-plated layer 13 and a silane coupling layer 14 were formed in this order on the upper and side surfaces of a second wiring layer 12. In the second example, however, only a silane coupling layer 14 was formed on the upper and side surfaces of a second wiring layer 12. The rest of the process was substantially similar to the first example.

Third Example

A third example of the present invention will be described.

In the first example, as shown in FIG. 1B, a primer layer 4 was formed on a first insulating resin layer 3 and a copper layer 5 was formed on the primer layer 4. In the third example, however, only a primer layer 4 was formed on a first insulating resin layer 3. The rest of the process was substantially similar to the first example.

Fourth Example

A fourth example of the present invention will be described.

In the third example, as shown in FIG. 3J, a tin-plated layer 13 and a silane coupling layer 14 were formed in this order on the upper and side surfaces of a second wiring layer 12. In the fourth example, however, only a silane coupling layer 14 was formed on the upper and side surfaces of a second wiring layer 12. The rest of the process was substantially similar to the third example.

(Reference Example)

A printed wiring board without having the technical features described above and a method of manufacturing the printed wiring board will be briefly described as a reference example of the printed wiring board and the method of manufacturing the printed wiring board according to the present embodiment.

Referring to FIGS. 6A, 6B, 6C, 6D, 6E, 6F, 6G, 6H, 6I, and 6J, description will be given of a conventional printed wiring board manufactured using a semi-additive method and a method of manufacturing the printed wiring board.

Figure 6A:
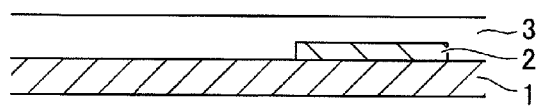
FIGS. 6A, 6B, 6C, 6D, 6E, 6F, 6G, 6H, 6I, and 6J is a set of schematic cross sections illustrating a flow of manufacturing a printed wiring board based on conventional art.

First, as shown in FIG. 6A, a first wiring layer 2 is formed on an insulating substrate 1, and then a first insulating resin layer 3 is formed covering the first wiring layer 2.

Figure 6B:
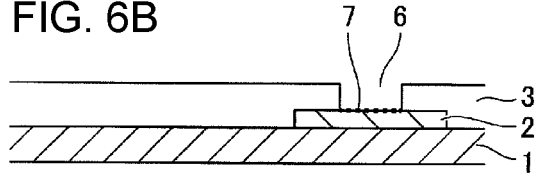

Then, as shown in FIG. 6B, via holes 6 are formed by laser irradiation, penetrating the first insulating resin layer 3 to expose the surface of the first wiring layer 2. In this case, smears 7 remain on the bottom surfaces of the via holes 6, or the sidewall surfaces (inner surfaces) thereof.

Figure 6C:
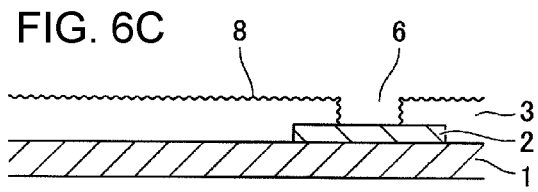

Then, as shown in FIG. 6C, the smears 7 are removed by desmear treatment. Through this desmear treatment, the surface of the first insulating resin layer 3 and the sidewall surfaces of the via holes 6 are roughened. The surface of the first insulating resin layer 3 roughened by this desmear treatment will be hereinafter referred to as roughened surface 8.

Figure 6D:
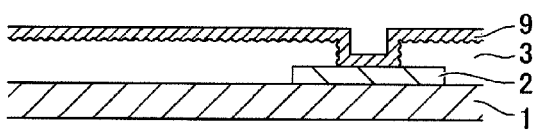

Then, as shown in FIG. 6D, an electroless copper plated layer 9 is formed by electroless plating to cover the bottom surfaces of the via holes 6, the sidewall surfaces thereof, and the roughened surface 8. In this case, the anchoring effect exerted by the asperities of the roughened surface 8 ensures adhesion of the copper electroless-plated layer 9.

Figure 6E:
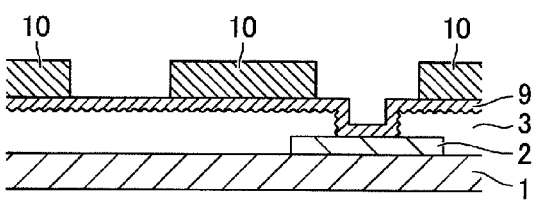

Then, as shown in FIG. 6E, a resist pattern 10 is formed on the copper electroless-plated layer 9 to cover non-wiring portions.

Figure 6F:
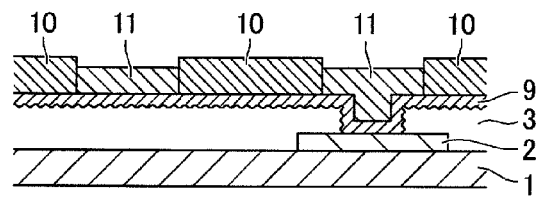

Then, as shown in FIG. 6F, a copper electroplated layer 11 is formed by copper electroplating on the copper electroless-plated layer 9 on which the resist pattern 10 is formed.

Figure 6G:
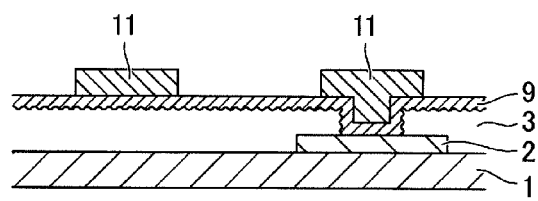

Then, as shown in FIG. 6G, the resist pattern 10 is removed using the resist stripping liquid.

Figure 6H:
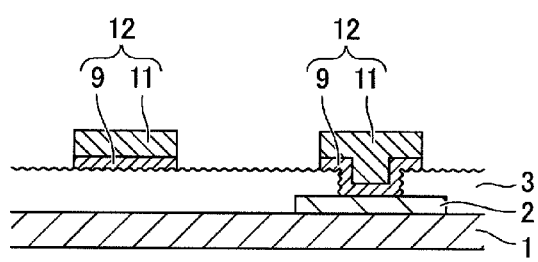

Then, as shown in FIG. 6H, the copper electroless-plated layer 9 is etched away at portions where the surface has been exposed, thereby forming a second wiring layer 12 including the copper electroless-plated layer 9 and the copper electroplated layer 11.

Figure 6I:
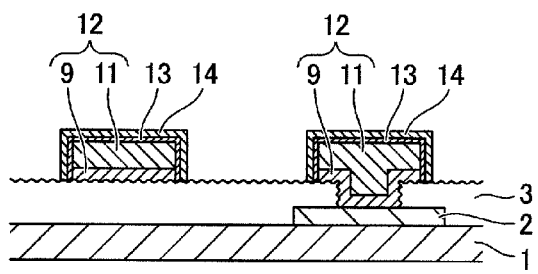

Then, as shown in FIG. 6I, a tin-plated layer 13 is formed by applying electroless plating treatment to the exposed surface of the second wiring layer 12, followed by forming a silane coupling layer 14 on the exposed surface of the tin-plated layer 13.

Figure 6J:
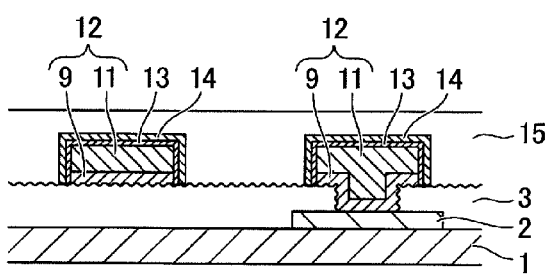

Then, as shown in FIG. 6J, a second insulating resin layer 15 is formed covering the second wiring layer 12 that includes the tin-plated layer 13 and the silane coupling layer 14. In this case, the second wiring layer 12, with its upper and side surfaces being provided with the tin-plated layer 13 and the silane coupling layer 14, can ensure adhesion to the second insulating resin layer 15.

With the manufacturing process described above, the upper and side surfaces of the second wiring layer 12 are not roughened but remain flat. Thus, adhesion is ensured between the second wiring layer 12 and the second insulating resin layer 15, and at the same time, high responsiveness is not lost in signal transmission due to skin effect. However, since the lower surface of the second wiring layer 12 is in contact with the surface (roughened surface 8) of the first insulating resin layer 3 roughened by the desmear treatment, the lower surface of the second wiring layer 12 is not flat but has asperities. Therefore, the high responsiveness in signal transmission is lost.

Furthermore, when the copper electroless-plated layer 9 is etched away, etching time is unavoidably increased due to the roughened surface of the first insulating resin layer 3. Specifically, longer etching time is needed to reliably remove copper caught in the concavities in the asperities formed on the roughened surface 8, creating, accordingly, thinner wiring and wider non-wiring portions. Therefore, the method set forth above is disadvantageous in forming micro lines and spaces.

PTL 1 mentioned above describes permitting a copper foil to adhere to a resin layer using an adhesive agent, and forming via holes by laser irradiation, followed by applying desmear treatment, thereby forming a copper electroless-plated layer as a seed layer for a semi-additive method.

With this technique, however, the base surface of the copper electroless-plated layer is roughened when etched, due to the use of the semi-additive method. The roughened surface entails overetching when etching away the copper caught in the concavities in the asperities formed on the roughened surface. The overetching may involve unwanted etching of the copper foil that forms the wiring, resulting in a thinner wiring pattern. Thus, this technique is not suitable for forming micro wiring.

PTL 2 mentioned above discloses a technique including forming a wiring pattern on a core base material, forming an insulating layer thereon, and transferring a copper layer onto the insulating layer. The copper layer in this case has been separately formed on a substrate such as a glass substrate having small surface asperities. The technique further includes forming a seed layer on the transferred copper layer, and finally forming a wiring pattern using a conventional semi-additive method. In this technique, the lower surface of the wiring layer is flat, and thus the issue of high-frequency signal delay can be solved.

However, use of the conventional semi-additive method may produce a thin wiring pattern for the same reason as in PTL 1. Thus, this technique is not suitable for forming micro wiring.

INDUSTRIAL APPLICABILITY

The present invention can provide a multilayer built-up printed wiring board having a wiring pattern capable of a rapid response with micro wiring and a method of manufacturing the multilayer built-up printed wiring board.

[Reference Signs List] 1 . . . Insulating substrate; 2 . . . First wiring layer; 3 . . . First insulating resin layer; 4 . . . Primer layer; 5 . . . Copper layer (copper foil); 6 . . . Via holes; 7 . . . Smears; 8 . . . Roughened surface of first insulating resin layer (roughened surface); 9 . . . Copper electroless-plated layer; 10 . . . Resist pattern; 11 . . . Copper electroplated layer; 12 . . . Second wiring layer; 13 . . . Tin-plated layer; 14 . . . Silane coupling layer; 15 . . . Second insulating resin layer; 101 to 104 . . . Printed wiring board; 105*a*, 105*b* . . . Printed wiring board

What is claimed is:

1. A method of manufacturing a multilayer printed wiring board including a plurality of layers formed on a laminate that is a lamination of an insulating substrate and a first wiring layer formed on the insulating substrate, wherein the method comprises:
    forming a first insulating layer on the laminate so as to cover the first wiring layer;
    forming a primer layer on the first insulating layer without forming a copper layer on the primer layer, the primer layer increasing adhesion between the first insulating layer and a copper electroless-plated layer;
    forming via holes penetrating the primer layer, and the first insulating layer to expose a surface of the first wiring layer;
    performing desmear treatment for removing smears generated in the via holes;
    forming the copper electroless-played layer on the surface of the primer layer and bottom surfaces and sidewall surfaces of the via holes;
    forming a resist pattern on a surface of the copper electroless-plated layer in regions where a second wiring layer is not to be formed, the resist pattern serving as a plating mask;
    forming the copper electroplated layer on a surface of the copper electroless-plated layer in regions where the resist pattern has not been formed;
    peeling the resist pattern;
    removing the copper electroless-plated layer in regions empty of the resist pattern to form a second wiring layer and expose the surface of the primer layer, the second wiring layer including the copper electroless-plated layer and the copper electroplated layer;
    forming a tin-plated layer on a surface of the second wiring layer and then forming a silane coupling layer on the surface of the tin-plated layer; and
    forming a second insulating layer so as to cover the primer layer and the second wiring layer where the tin-plated layer and the silane coupling layer have been formed.

2. A method of manufacturing a multilayer printed wiring board including a plurality of layers formed on a laminate that is a lamination of an insulating substrate and a first wiring layer formed on the insulating substrate, wherein the method comprises:
    forming a first insulating layer on the laminate so as to cover the first wiring layer;
    forming a primer layer on the first insulating layer without forming a copper layer on the primer layer, the primer layer increasing adhesion between the first insulating layer and a copper electroless-plated layer;
    forming via holes penetrating the primer layer, and the first insulating layer to expose a surface of the first wiring layer;
    performing desmear treatment for removing smears generated in the via holes;
    forming the copper electroless-plated layer on the surface of the primer layer and bottom surfaces and sidewall surfaces of the via holes;
    forming a resist pattern on a surface of the copper electroless-plated layer in regions where a second wiring layer is not to be formed, the resist pattern serving as a plating mask;
    forming a copper electroplated layer on the surface of the copper electroless-plated layer in regions where the resist pattern has not formed;
    peeling the resist pattern;
    removing the copper electroless-plated layer in regions empty of the resist pattern to form a second wiring layer and expose the surface of the primer layer, the second wiring layer including the copper electroless-plated layer and the copper electroplated layer;
    forming a silane coupling layer on the surface of the second wiring layer; and
    forming a second insulating layer so as to cover the primer layer and the second wiring layer where the silane coupling layer has been formed.

3. The method of manufacturing a multilayer printed wiring board according to claim 1, wherein a laser drill is used for said forming the via holes.

4. The method of manufacturing a multilayer printed wiring board according to claim 2, wherein a laser drill is used for said forming the via holes.

5. The method of manufacturing a multilayer printed wiring board according to claim 1, wherein the primer layer contains an epoxy resin.

6. The method of manufacturing a multilayer printed wiring board according to claim 3, wherein the primer layer contains an epoxy resin.

7. The method of manufacturing a multilayer printed wiring board according to claim 1, wherein the primer layer contains a polyimide resin or a polyamide resin.

8. The method of manufacturing a multilayer printed wiring board according to claim 2, wherein the primer layer contains a polyimide resin or a polyamide resin.

9. The method of manufacturing a multilayer printed wiring board according to claim 3, wherein the primer layer contains a polyimide resin or a polyamide resin.

\* \* \* \* \*